(12) United States Patent
Tanaka et al.

(10) Patent No.: US 9,837,694 B2
(45) Date of Patent: Dec. 5, 2017

(54) FILTER CHARACTERISTIC TUNING APPARATUS, TUNABLE FILTER APPARATUS AND CONTROL METHOD FOR TUNABLE FILTER APPARATUS

(71) Applicant: KABUSHIKI KAISHA TOSHIBA, Tokyo (JP)

(72) Inventors: Junya Tanaka, Tokyo (JP); Hiroshi Takahashi, Kanagawa (JP); Rie Katsuki, Kanagawa (JP); Akihito Ogawa, Kanagawa (JP); Hiroyuki Kayano, Kanagawa (JP); Noritsugu Shiokawa, Kanagawa (JP); Tamio Kawaguchi, Kanagawa (JP); Hiroaki Ikeuchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 127 days.

(21) Appl. No.: 15/062,490

(22) Filed: Mar. 7, 2016

(65) Prior Publication Data

US 2016/0268663 A1 Sep. 15, 2016

(30) Foreign Application Priority Data

Mar. 11, 2015 (JP) ................................. 2015-048541

(51) Int. Cl.
*H01P 1/203* (2006.01)
*H03J 1/00* (2006.01)

(52) U.S. Cl.
CPC ...... *H01P 1/20372* (2013.01); *H01P 1/20381* (2013.01); *H03J 1/00* (2013.01)

(58) Field of Classification Search
CPC .......... H01P 1/202–1/2056; H01P 7/04–7/105
See application file for complete search history.

(56) References Cited

U.S. PATENT DOCUMENTS

| 5,391,543 A * | 2/1995 | Higaki | ........... H01P 7/082 333/235 |
| 6,778,042 B2 * | 8/2004 | Terashima | ........... H01P 1/203 333/205 |

(Continued)

FOREIGN PATENT DOCUMENTS

| JP | H03-051518 | 3/1991 |
| JP | 2001-211004 | 8/2001 |

(Continued)

*Primary Examiner* — Dean Takaoka
*Assistant Examiner* — Alan Wong
(74) *Attorney, Agent, or Firm* — Finnegan, Henderson, Farabow, Garrett & Dunner, L.L.P.

(57) ABSTRACT

According to an embodiment, a filter characteristic tuning apparatus includes a characteristic tuning member, an elastic member, a first movable member, a second movable member, and a driving mechanism. The elastic member comes in contact with a characteristic tuning member by deformation, and separates from the characteristic tuning member by a restoring force. The first movable member deforms the elastic member in a closing operation. The driving mechanism displaces a second movable member such that a projection opens/closes the first movable member. The characteristic tuning member changes a gap between the characteristic tuning member and the resonator by a linear driving force obtained by converting the transmitted rotary driving force.

11 Claims, 12 Drawing Sheets

(56) References Cited

U.S. PATENT DOCUMENTS

| | | | |
|---|---|---|---|
| 7,205,868 B2 * | 4/2007 | Park | ........................ H01P 1/205 333/203 |
| 8,179,212 B2 * | 5/2012 | Seo | ....................... H01P 1/2053 333/203 |
| 2008/0167191 A1 | 7/2008 | Sato et al. | |
| 2009/0167460 A1 | 7/2009 | Akasegawa et al. | |

FOREIGN PATENT DOCUMENTS

| | | |
|---|---|---|
| JP | 2002-141705 | 5/2002 |
| JP | 2002-204102 | 7/2002 |
| JP | 2003-214419 | 7/2003 |
| JP | 2008-028835 | 2/2008 |
| JP | 2008-172305 | 7/2008 |
| JP | 2008-172652 | 7/2008 |
| JP | 2009-065777 | 3/2009 |
| JP | 2009-177349 | 8/2009 |
| JP | 3171841 | 11/2011 |
| JP | 2013-087777 | 5/2013 |

\* cited by examiner

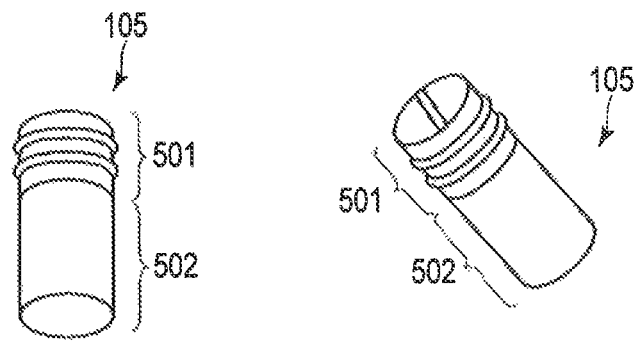
F I G. 5A    F I G. 5B
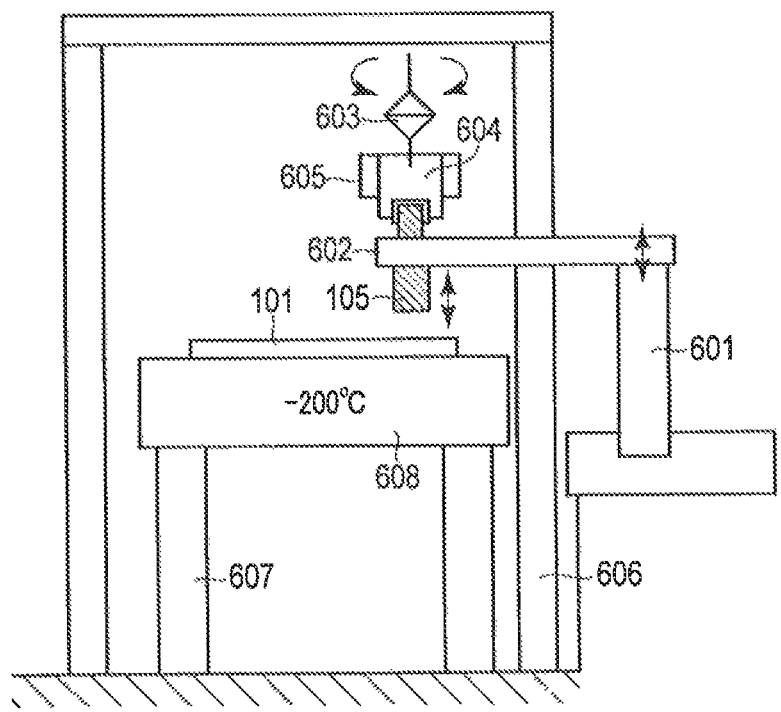
F I G. 6

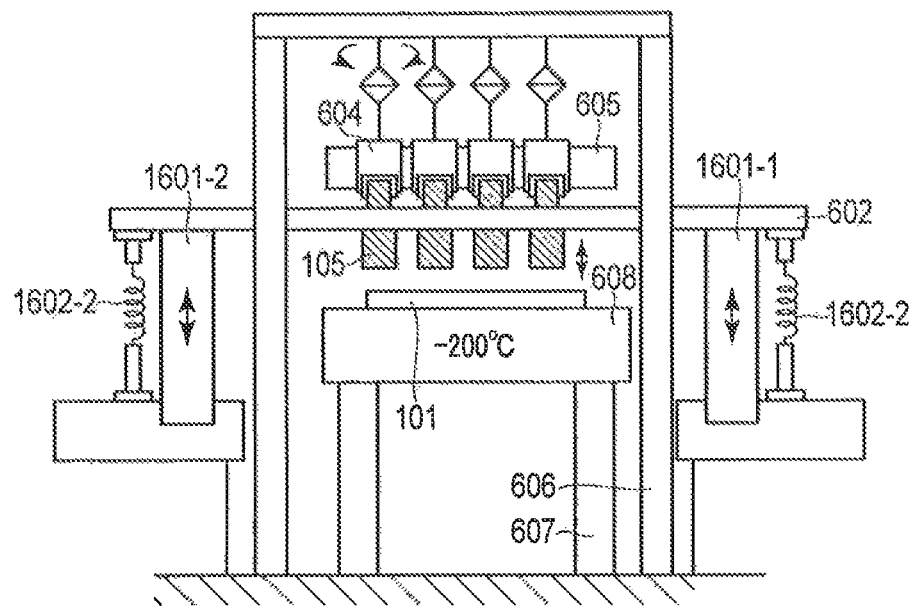
F I G. 16
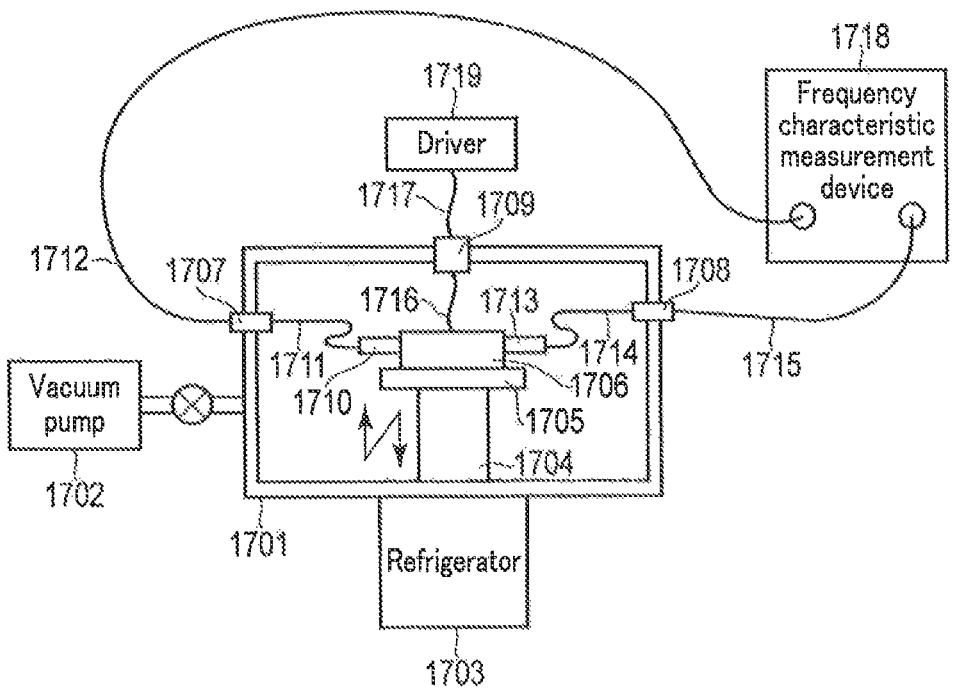
F I G. 17

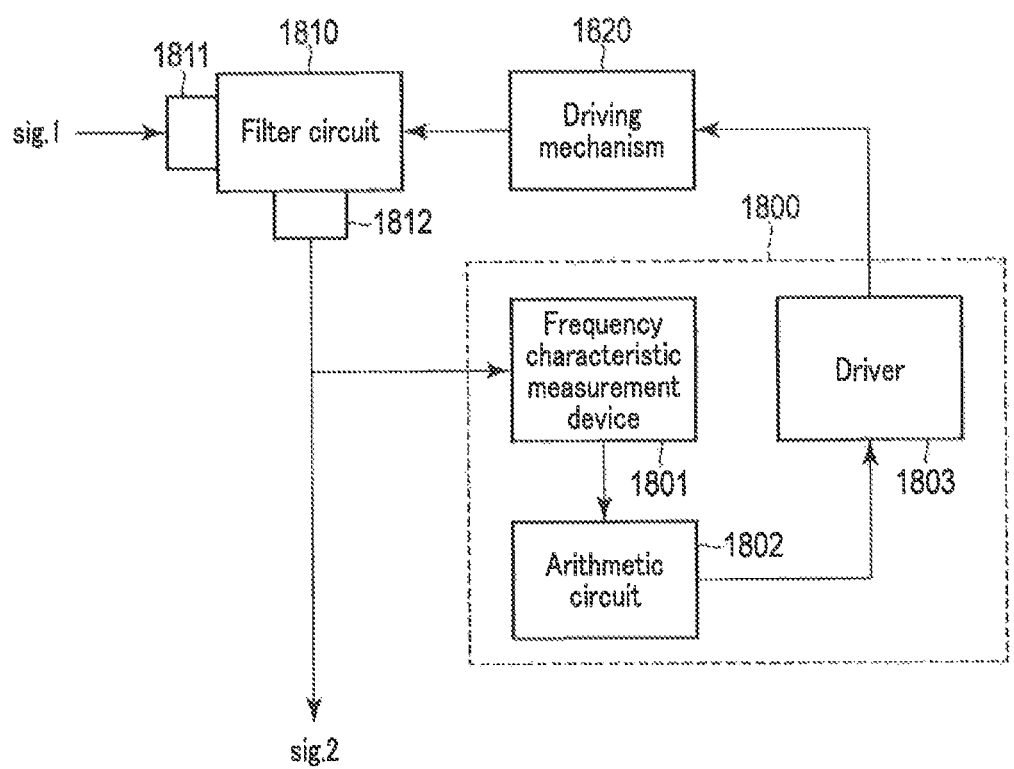
F I G. 18

FILTER CHARACTERISTIC TUNING APPARATUS, TUNABLE FILTER APPARATUS AND CONTROL METHOD FOR TUNABLE FILTER APPARATUS

CROSS-REFERENCE TO RELATED APPLICATIONS

This application is based upon and claims the benefit of priority from Japanese Patent Application No. 2015-018541, filed Mar. 11, 2015, the entire contents of which are incorporated herein by reference.

FIELD

Embodiments described herein relate generally to the tuning of filter characteristics.

BACKGROUND

A communication apparatus for performing wireless or wired information communication includes various signal processing devices such as an amplifier, mixer, and filter, A bandpass filter as a kind of filter passes a signal having a frequency falling within a passband, and cuts off (attenuates) a signal having a frequency falling outside the passband (falling within a stopband). For example, the characteristics of a bandpass filter such as the center frequency of the passband and the passband width are designed in accordance with the specifications of a communication system to which the bandpass filter is applied.

For example, as the skirt characteristic (i.e., the cutoff characteristic near the boundary between the passband and stopband) of a bandpass filter becomes steeper, a necessary guard band width decreases, so the frequency utilization efficiency can be increased. The bandpass filter can be installed by a planar circuit filter such as a microstrip line filter. The planar circuit filter can achieve a steep skirt characteristic by cascading resonators.

When forming resonators by using a general conductor material, an increase in transmission loss caused by cascading the resonators poses a problem. For example, even when resonators are formed by using an electrically good conductor material such as copper (Cu) or silver (Ag), the number of resonators which can be cascaded is limited. To cascade a number of resonators, it is effective to form the resonators by using a superconducting material. Even when compared to the electrically good conductor material, the superconducting material has a very low surface resistance in a high-frequency region, and can suppress an increase in transmission loss caused by cascading. That is, a bandpass filter having a steep skirt characteristic can be implemented by cascading resonators using the superconducting material.

Also, a tunable filter having a variable filter characteristic (i.e., a variable frequency characteristic) is sometimes necessary to, e.g., make the use band changeable. Some kind of tunable filters have a variable passband center frequency, and the passband and stopband also change in accordance with a change in center frequency. When the center frequency of the passband is changed, deviation of the shape of the filter characteristic from an ideal shape is unpreferable. Accordingly, the tunable filter is also required to suppress the disturbance of the shape of the filter characteristic when the center frequency of the passband is changed.

General required specifications of the tunable filter are that the variable range of the band is wide, the band change is continuous, the insertion loss is small, the cutoff characteristic is steep (i.e., the Q value is high), the whole filter including an adjusting mechanism is light and small, and the operation reliability and reproducibility are high.

The filter characteristics of the bandpass filter such as the center frequency of the passband, the passband width, the cutoff characteristic, and the out-of-band suppression characteristic are determined by, e.g., the resonance frequency of each resonator, the coupling coefficient between resonators, and the external Q value. Accordingly, a tunable filter can be implemented by changing the resonance frequency of each resonator and the coupling coefficient between resonators. That is, when the principle of the tunable filter is explained by the materials science, the tunable filler changes the filter characteristics by changing at least one of the effective relative dielectric constant and effective relative permeability by some means. On the other hand, when the principle of the tunable filter is explained by the circuit science, the tunable filter changes the filter characteristics by changing at least one of the capacitance and inductance by some means.

Presently, methods of implementing the tunable filter are roughly classified into three categories, i.e., electric field control, magnetic field control, and mechanical control. To maintain a high Q value, an adjusting mechanism having a small loss is favorable. The feature of a mechanical-control-type tunable filter is that the variable range of the band is maximum and the loss is small. This mechanical-control-type tunable filter changes the filter characteristics by changing the gap length between a (superconducting) filter substrate and a characteristic tuning member (typically, a dielectric material or magnetic material).

Before an operation is started, the initial gap length of the mechanical-control-type tunable filter is sometimes adjusted in order to finely correct a shift of the filter characteristics caused by, e.g., manufacturing variations. Although the initial gap length is manually adjustable, manual adjustment is unpreferable from the viewpoints of speed and accuracy. Especially when the tunable filter is a superconducting filter, it is necessary to cancel/set a vacuum low-temperature environment whenever performing an initial gap length adjusting work and filter characteristic checking work. Therefore, it takes a long time to complete these works.

BRIEF DESCRIPTION OF THE DRAWINGS

FIG. 5A is a perspective view showing an example of a characteristic tuning member shown in FIG. 1;

FIG. 5B is a perspective view showing the example of the characteristic tuning member shown in FIG. 1;

FIG. 6 is a sectional view partially showing an example of the tunable filter apparatus according to the first embodiment;

FIG. 16 is a sectional view partially showing an example of a tunable filter apparatus according to the second embodiment;

FIG. 17 is a block diagram exemplarily showing a tunable filter apparatus according to the third embodiment;

FIG. 18 is a block diagram exemplarily showing a tunable filter apparatus according to the fourth embodiment;

DETAILED DESCRIPTION

Figure 1:
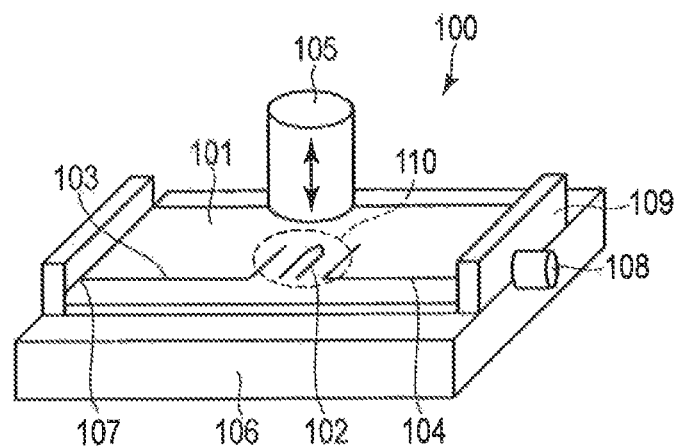
FIG. 1 is a perspective view partially showing an example of a tunable filter apparatus according to the first embodiment.

An explanation of embodiments will be described below with reference to the accompanying drawings.

According to an embodiment, a filter characteristic tuning apparatus includes a characteristic tuning member, an elastic member, a first driving mechanism, a first movable member, a second movable member, and a second driving mechanism. The characteristic tuning member faces a resonator on a first surface of a substrate of a tunable filter apparatus. The erasure member comes in contact with the characteristic tuning member by deformation, and separates from the characteristic tuning member by a restoring force. The first driving mechanism rotates the elastic member. The first movable member deforms the elastic member by externally coming into contact with the elastic member in a closing operation, and causes the elastic member to use a restoring force in an opening operation. The second movable member has a projection for opening/closing the first movable member. The second driving mechanism displaces the second movable member such that the projection opens/closes the first movable member. The elastic member transmits a rotary driving force from the first driving mechanism by coming into contact with the characteristic tuning member. The characteristic tuning member changes a gap between the characteristic tuning member and the resonator by a linear driving force obtained by converting the transmitted rotary driving force.

According to an embodiment, a tunable filter apparatus includes a substrate, a resonator, a characteristic tuning member, a supporting member, an elastic member, a first driving mechanism, a switching member, a gapped member and a second driving mechanism. The resonator is formed by patterning on a first surface of the substrate by using a conductor material. The characteristic tuning member contains one of a dielectric material, a magnetic material, and a conductor material, and has a screw portion. The supporting member supports the characteristic tuning member such that the characteristic tuning member faces the resonator. The elastic member comes in contact with a sidewall of the characteristic tuning member by deforming in accordance with a first external force, and separates from the sidewall of the characteristic tuning member by a restoring force when the first external force is not acting. The first driving mechanism rotates the elastic member. The switching member includes a movable member that is displaced in accordance with a second external force, thereby coming into contact with an outer wall of the elastic member and causing the first external force to act on the elastic member, and an elastic body that separates the movable member from the outer wall of the elastic member by displacing the movable member by a restoring force when the second external force is not acting. The gapped member has a gap that accommodates a set of the characteristic tuning member, the elastic member, and the switching member, and has a projection on a first inner wall of the gap. The second driving mechanism displaces the gapped member such that the second external force acts on the switching member by clamping an outer wall of the switching member accommodated in the gap by the projection of the gap and a second inner wall facing the first inner wall. While the elastic member is in contact with a circumferential wall of the characteristic tuning member, the elastic member transmits, to the characteristic tuning member via a frictional force, a rotary driving force received from the first driving mechanism. The characteristic tuning member is displaced in accordance with a linear driving force obtained by converting, by the screw portion, the rotary driving force transmitted from the elastic member, thereby changing a gap length between the characteristic tuning member, and a corresponding resonator.

According to an embodiment, a control method for a tunable filter apparatus is provided. The apparatus includes a substrate, a resonator, a characteristic tuning member, a supporting member, a characteristic tuning member, a supporting member, an elastic member, a first driving mechanism, a switching mechanism, a gapped member and a second driving mechanism. The resonator is formed by patterning on a first surface of the substrate by using a conductor material. The characteristic tuning member contains one of a dielectric material, a magnetic material, and a conductor material, and has a screw portion. The supporting member supports the characteristic tuning member such that the characteristic tuning member faces the resonator. The elastic member comes in contact with a sidewall of the characteristic tuning member by deforming in accordance with a first external force, and separates from the sidewall of the characteristic tuning member by a restoring force when the first external force is not acting. The first driving mechanism is connected to the elastic member. The switching member includes a movable member that is displaced in accordance with a second external force, thereby coming into contact with an outer wall of the elastic member and causing the first external force to act on the elastic member, and an elastic body that separates the movable member from the outer wall of the elastic member by displacing the movable member by a restoring force when the second external force is not acting. The gapped member has a gap that accommodates a set of the characteristic tuning member, the elastic member, and the switching member, and has a projection on a first inner wall of the gap. The second driving mechanism is connected to the gapped member. The method includes causing the first driving mechanism to rotate the elastic member; and causing the second driving mechanism to displace the gapped member such that the second external force acts on the switching member by clamping an outer wall of the switching member accommodated in the gap by the projection of the gap and a second inner wall facing the first inner wall. While the elastic member is in contact with a circumferential wall of the characteristic tuning member, the elastic member transmits, to the characteristic tuning member via a frictional force, a rotary driving force received from the first driving mechanism. The characteristic tuning member is displaced in accordance with a linear driving force obtained by converting, by the screw portion, the rotary driving force transmitted from the elastic member, thereby changing a gap length between the characteristic tuning member and a corresponding resonator.

Note that in the following description, the same or similar reference numerals denote the same elements as or elements similar to already explained elements, and a repetitive explanation will basically be omitted.

First Embodiment

A tunable filter apparatus according to the first embodiment can be a microstrip-line-type bandpass filter exemplarily shown in FIG. 1. A tunable filter apparatus 100 shown in FIG. 1 includes a dielectric substrate 101, resonator 102, signal input line 103, signal output line 104, characteristic tuning member 105, metal package 106, connection electrode 107, coaxial connector 108, and connection electrode 109. Note that the circuit elements (including the resonator 102, signal input line 103, and signal output line 104) on a first surface of the dielectric substrate 101, the characteristic tuning member 105, and the metal package 106 can also collectively be referred to as a filter apparatus.

The dielectric substrate 101 is formed into an almost plate-like shape by using a low-loss material having a small dielectric dissipation factor, e.g., $Al_2O_3$ (sapphire), MgO, or $LaAlO_3$. The resonator 102 is formed by patterning on the first surface of the dielectric substrate 101 by using a superconducting material. In addition, the signal input line 103 and signal output line 104 are formed by patterning on the first surface of the dielectric substrate 101 by using a superconducting material. The resonator 102 is electrically connected to the signal input line 103 and signal output line 104.

More specifically, the circuit elements (including the resonator 102, signal input line 103, and signal output line 104) arranged on the first surface of the dielectric substrate 101 can be formed by patterning by forming a superconductor film on the first surface by using, e.g., a Y—Ba—Cu—O-based superconducting material (to be referred to as YBCO hereinafter), and processing the super conductor film by using photolithography.

Note that as the superconducting material, it is also possible to adopt, instead of YBCO, another oxide superconducting material such as an R—Ba—Cu—O-based material (R is Nb, Yra, Sm, or Ho), a Bi—Sr—Ca—Cu—O-based material, a Pb—Bi—Sr—Ca—Cu—O-based material, or a $CuBa_pCa_qCu_zO_x$-based material ($1.5<p<2.5$, $2.5<q<3.5$, and $3.5<r<4.5$), or a metal superconducting material such as niobium or niobium tin. Note also that as the material of the circuit elements, the superconducting material need not always be adopted, and another conductor material can also be adopted.

The resonator 102 can be a hairpin-type resonator exemplarily shown in FIG. 1, and can also be, e.g., a spiral-type resonator or S-shaped resonator. Note that in this example shown in FIG. 1, the total number of resonators 102 is one. However, a plurality of resonators 102 may also be cascaded as in a tunable filter apparatus 400 exemplarily shown in FIG. 4. The tunable filter apparatus 400 can obtain a steep skirt characteristic by connecting the plurality of resonators 102.

Also, a ground film is formed on a second surface of the dielectric substrate 101 by using a superconducting material. The second surface is the reverse side of the above-mentioned first surface. This ground film can be used as a ground electrode. The ground electrode can also be formed by depositing, e.g., an Ag film on the ground film.

The metal package 106 accommodates, e.g., the dielectric substrate 101, resonator 102, signal input line 103, and signal output line 104 described above. The metal package 106 shields the accommodated members from high frequencies. The metal package 106 can be formed into an almost boxy shape by using oxygen-free cooper having a high thermal conductivity. Note that the material of the metal package 106 can be replaced with, e.g., pure aluminum, an aluminum alloy, or a copper alloy, and can also be replaced with, e.g., a material (more specifically, Kovar, Invar, or 42 Alloy) having a thermal shrinkage close to that of the dielectric substrate 101.

The almost boxy metal package 106 forms an internal space closed by the top, bottom, and sidewalls. Note that FIG. 1 shows portions of the bottom and sidewalls of the metal package 106, and does not show the rest. Referring to FIG. 1, the inner surface of the bottom of the metal package 106 is in contact with the ground electrode formed on the second surface of the dielectric substrate 101. On the other hand, the inner surface of the top of the metal package 106 faces the first surface of the dielectric substrate 101.

The metal package 106 may also be separated into a package main body corresponding to the bottom and sidewalls of the metal package 106 and having an opening on the side opposite to the bottom, and a lid corresponding to the top of the metal package 106. In this case, the internal space can be formed by closing the opening of the package main body with the lid.

Referring to FIG. 1, the coaxial connector 108 as an output connector is attached to the sidewall of the metal package 106. The above-described signal output line 104 is electrically connected to the central conductor of the coaxial connector 108 via the connection electrode 109. Although not shown in FIG. 1, a coaxial connector as an input connector is similarly attached to the sidewall of the metal package 106. The above-described signal input line 103 is electrically connected to the central conductor of the coaxial connector (not shown) via the connection electrode 107. This electrical connection can be implemented by various methods such as wire bonding by ultrasonic thermal bonding, tape bonding, and soldering.

The connection electrodes 107 and 109 can be formed by vapor deposition, sputtering, or the like by using a metal material such as gold (Au) or silver (Ag) in order to reduce the contact resistance. More specifically, each of the connection electrodes 107 and 109 can be a multilayered film containing at least one of gold and silver.

The characteristic tuning member 105 typically contains a dielectric material such as alumina or a magnetic material. The characteristic tuning member 105 may also contain a conductor material such as a metal. Furthermore, at least a portion of the characteristic tuning member 105 is a screw.

The characteristic tuning member 105 is accommodated in the metal package 106 like the dielectric substrate 101, resonator 102, signal input line 103, and signal output line 104 described above. The characteristic tuning member 105 is fixed by its screw to a supporting member not shown in FIG. 1, and supported by the supporting member so as to face the first surface of the dielectric substrate 101 with a gap between them.

Figure 2:
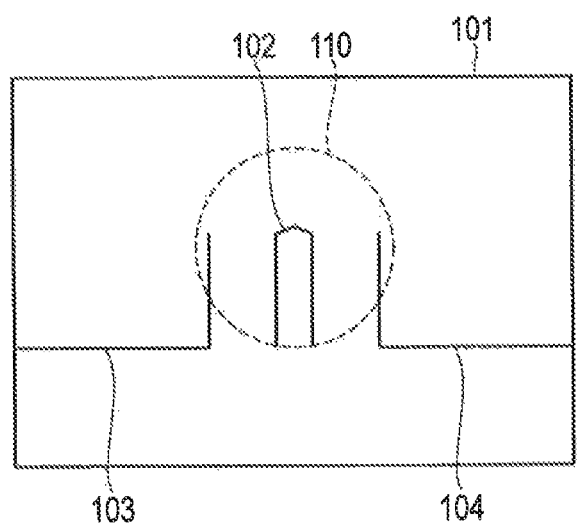
FIG. 2 is a plan view exemplarily showing a resonator formed by patterning on the first surface of a dielectric substrate shown in FIG. 1.

More specifically, the characteristic tuning member 105 is arranged to face the resonator 102, and a projection 110 exemplarily shown in FIGS. 1 and 2 is obtained by projecting the characteristic tuning member 105 in a direction almost perpendicular to the first surface of the dielectric substrate 101. The horizontal position of the characteristic tuning member 105 (a position in a plane almost parallel to the first surface of the dielectric substrate 101) is preferably so determined as to increase an area covering the resonator 102 in the projection 110.

The characteristic tuning member 105 is typically formed into the shape of a circular or square pillar. The characteristic tuning member 105 may also be supported such that the bottom surface is almost parallel to the first surface of the dielectric substrate 101. The dimensions of the bottom surface of the characteristic tuning member 105 may also be designed in accordance with the dimension of the resonator 102 in the lateral direction. The lateral and longitudinal directions of the resonator 102 are almost parallel to the first surface of the dielectric substrate 101.

Assuming that the area of the projection 110 is the bottom area and the gap length between the dielectric substrate 101 and the bottom surface of the characteristic tuning member 105 is the height, the volume (to be referred to as a space volume hereinafter) of a space defined between the bottom surface of the characteristic tuning member 105 (i.e., the surface facing the dielectric substrate 101) and the projection 110 can be calculated by bottom area×height.

When, for example, the characteristic tuning member 105 is displaced perpendicularly with respect to the first surface of the dielectric substrate 101, the gap length between the projection 110 and the bottom surface of the characteristic tuning member 105 changes. Therefore, the space volume increases or decreases in accordance with the increase or decrease in gap length caused by the displacement of the characteristic tuning member 105. Note that the characteristic tuning member 105 need not be displaced strictly perpendicularly with respect to the first surface of the dielectric substrate 101. For example, the gap length can also be changed through a rotary motion.

Figure 3:
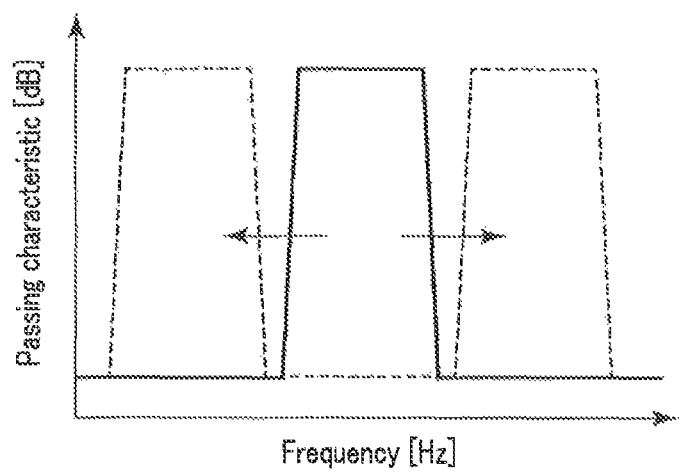
FIG. 3 is a graph exemplarily showing the frequency characteristic of the tunable filter apparatus shown in FIG. 1.

When the space volume increases or decreases, the resonance frequency of the resonator 102 changes. As a consequence, when the characteristic tuning member 105 is slightly displaced, the filter characteristics (e.g., the transmittance and reflectance) of the tunable filter apparatus 100 abruptly change as exemplarily shown in FIG. 3. More specifically, when the space volume increases (i.e., when the gap length increases), the center frequency of the passband of the tunable filter apparatus 100 rises. On the other hand, when the space volume decreases (i.e., when the gap length decreases), the center frequency of the passband of the tunable filter apparatus 100 falls. In the example shown in FIG. 3, the passband width remains almost unchanged regardless of the rise and fall of the center frequency of the passband, and the shape of the filter characteristics is hardly disturbed.

When adjusting the initial gap length, the characteristic tuning member 105 is accurately displaced by using a rotary driving force from a rotary driving mechanism (to be described later). When regularly adjusting the gap length, the characteristic tuning member 105 is rapidly displaced in a broad range in synchronism with the motion of the supporting member supporting the characteristic tuning member 105. Note that if the characteristic tuning member 105 is unlimitedly displaceable, the characteristic tuning member 105 may abut against the dielectric substrate 101 and damage it. Accordingly, the movable range of the characteristic tuning member 105 is preferably limited so as not to damage the dielectric substrate 101.

The initial gap length can be adjusted before the tunable filter apparatus 100 starts operating in order to finely correct the resonance frequency of each resonator so that the initial filter characteristics approach desired characteristics. More specifically, the initial resonance frequency of the resonator 102 sometimes deviates from the designed value due to various factors such as variations in thickness or material characteristic of the dielectric substrate 101, and shifts of the patterning dimensions of the resonator 102. Consequently, the initial filter characteristics of the tunable filter apparatus 100 deviate from the desired characteristics. In addition, to downsize the tunable filter apparatus 100, the dielectric substrate 101 is sometimes so designed as to have a high dielectric constant. In this case, if complicated wiring patterns are adopted in order to obtain a desired wiring impedance, the influences of the above-mentioned various factors on the initial filter characteristics further increase.

Figure 4:
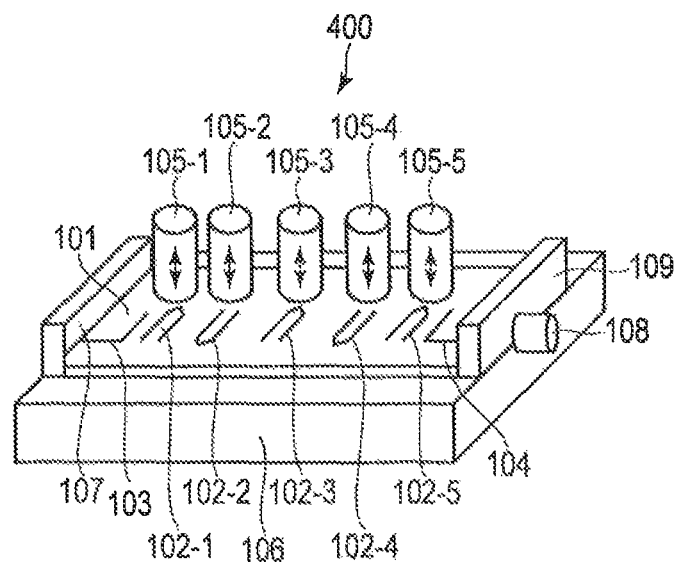
FIG. 4 is a perspective view showing a modification of FIG. 1.

Note that when a plurality of resonators 102 are arranged on the first surface of the dielectric substrate 101 as in the tunable filter apparatus 400 exemplarily shown in FIG. 4, it is also possible to prepare characteristic tuning members 105 equal in number to the resonators 102. Each of the plurality of characteristic tuning members 105 is supported by a supporting member so as to face a corresponding resonator 102. The gap lengths between the characteristic tuning members 105 and corresponding resonators 102 can be adjusted either individually or simultaneously.

FIGS. 5A and 5B show a practical example of the characteristic tuning member 105. The characteristic tuning member 105 shown in FIGS. 5A and 5B has an almost columnar shape. A screw portion 501 positioned on the top side is a male screw, and a dielectric portion 502 positioned on the bottom side is formed by using a dielectric material. When given a rotary driving force, the screw portion 501 converts this rotary driving force into a linear driving force, and linearly moves by this linear driving force. The dielectric portion 502 linearly moves in synchronism with the screw portion 501. Note that the characteristic tuning member 105 can be formed by connecting the screw portion 501 and dielectric portion 502 formed by using different materials such that they are displaced in synchronism with each other, and can also be molded integrally by processing at least a portion of the circumferential wall of an almost columnar dielectric material into the screw portion 501.

As exemplarily shown in FIG. 6, the tunable filter apparatus according to the first embodiment includes the dielectric substrate 101, the characteristic tuning member 105, a linear actuator 601, a supporting member 602, a rotary driving mechanism 603, an elastic member 604, a movable gapped mechanism 605, a supporting member 606, a heat-insulating supporting member 607, and a cold plate 608. Note that the linear actuator 601, the supporting member 602, the rotary driving mechanism 603, the elastic member 604, the movable gapped mechanism 605, and a switching member (to be described later) can also collectively be called a filter characteristic tuning apparatus.

In this example shown in FIG. 6, circuit elements are formed on the first surface of the dielectric substrate 101 by using a superconducting material, and the dielectric substrate 101 is placed on the cold plate 608. The cold plate 608 is cooled by a refrigerator not shown in FIG. 6, and maintains the dielectric substrate 101 in a low-temperature state so that the circuit elements show superconducting characteristics.

The heat-insulating supporting member 607 supports the cold plate 608 apart from the various constituent elements of the tunable filter apparatus shown in FIG. 6 in order to suppress heat conduction to the cold place 608. Also, the heat-insulating supporting member 607 preferably has high heat insulating properties in order to suppress heat conduction to the cold plate 608 via the heat-insulating supporting member 607.

The linear actuator 601 is connected to a first end portion of the supporting member 602, and gives a linear driving force to the first end portion of the supporting member 602 when regularly adjusting the gap length. The linear actuator 601 can be implemented by using, e.g., a piezoelectric element, magnetostrictive element, or electric motor. More specifically, a lead wire (not shown) is connected to the linear actuator 601 in order to apply a control voltage. The linear actuator 601 expands or contracts in accordance with the control voltage, thereby generating a linear driving force almost perpendicular to the first surface of the dielectric substrate 101.

The supporting member 602 is formed into an almost pillar-like shape or almost plate-like shape, and receives the linear driving force from the linear actuator 601 connected to the first end portion. A screw portion (a female screw) for fixing the characteristic tuning member 105 is formed in a second end portion of the supporting member 602, which is opposite to the first end portion. When the first end portion receives the linear driving force, the supporting member 602 rotates around a fulcrum formed between the first and second end portions. For example, when the first end portion of the supporting member 602 falls because the linear driving force reduces, the characteristic tuning member 105 fixed to the second end portion of the supporting member 602 rises, and the gap length increases. On the other hand, when the second end portion of the supporting member 602 rises because the linear driving force increases, the characteristic tuning member 105 fixed to the second end portion of the supporting member 602 falls, and the gap length decreases.

The rotary driving mechanism 603 is supported by the supporting member 606 and connected to the elastic member 604. When adjusting the initial gap length, the rotary driving mechanism 603 gives a rotary driving force to the elastic member 604. As will be described later, the rotary driving mechanism 603 can be rotary actuators equal in number to the elastic members 604, and can also be a combination of rotary actuators fewer than the elastic members 604, and a transmission mechanism (e.g., a plurality of gears) for transmitting a rotary driving force generated by the rotary actuators to each elastic member 604.

The elastic member 604 has an almost cylindrical shape, and accommodates the characteristic tuning member 105 in the hollow portion. The elastic member 604 is connected to the rotary driving mechanism 603, and rotated by the rotary driving force received from the rotary driving mechanism 603. Note that one elastic member 604 is prepared for one characteristic tuning member 105.

Figure 7:
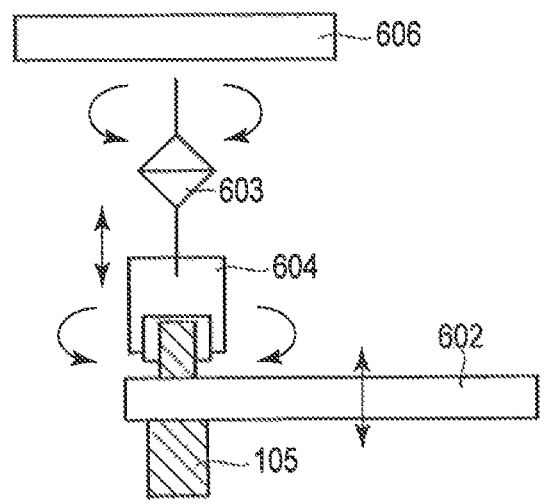
FIG. 7 is a view exemplarily showing the moving directions of a characteristic tuning member, supporting member, rotary driving mechanism, and elastic member shown in FIG. 6.

Furthermore, when receiving an external force from a switching member not shown in FIG. 6, the elastic member 604 deforms in accordance with this external force, and the inner wall of the elastic member 604 comes in contact with the circumferential wall of the characteristic tuning member 105. When the inner wall of the elastic member 604 is in sufficient contact with the circumferential wall of the characteristic tuning member 105, the rotary driving force from the rotary driving mechanism 603 is transmitted to the characteristic tuning member 105 by the frictional force generated between these walls. As exemplarily shown in FIG. 7, the characteristic tuning member 105 converts this rotary driving force into a linear driving force by the screw portion, and is displaced almost perpendicularly with respect to the first surface of the dielectric substrate 101 in accordance with the linear driving force.

On the other hand, if no sufficient external force is received from the switching member, the inner wall of the elastic member 604 separates, by its own restoring force, from the circumferential wall of the characteristic tuning member 105. If the inner wall of the elastic member 604 is not in sufficient contact with the circumferential wall of the characteristic tuning member 105, the rotary driving force from the rotary driving mechanism 603 is not transmitted to the characteristic tuning member 105. That is, the elastic member 604 rotates, but the characteristic tuning member 105 keeps standing still.

The elastic member 604 transmits the force to the characteristic tuning member 105 by using the frictional force between the inner wall of the elastic member 604 and the circumferential wall of the characteristic tuning member 105. Therefore, the elastic member 604 is preferably so designed as to have an inner wall having a high friction coefficient. For example, the material of the inner wall of the elastic member 604 can be a rubber material, and can also be an aluminum material on which a high-friction tape is adhered.

Figures 8, 9:
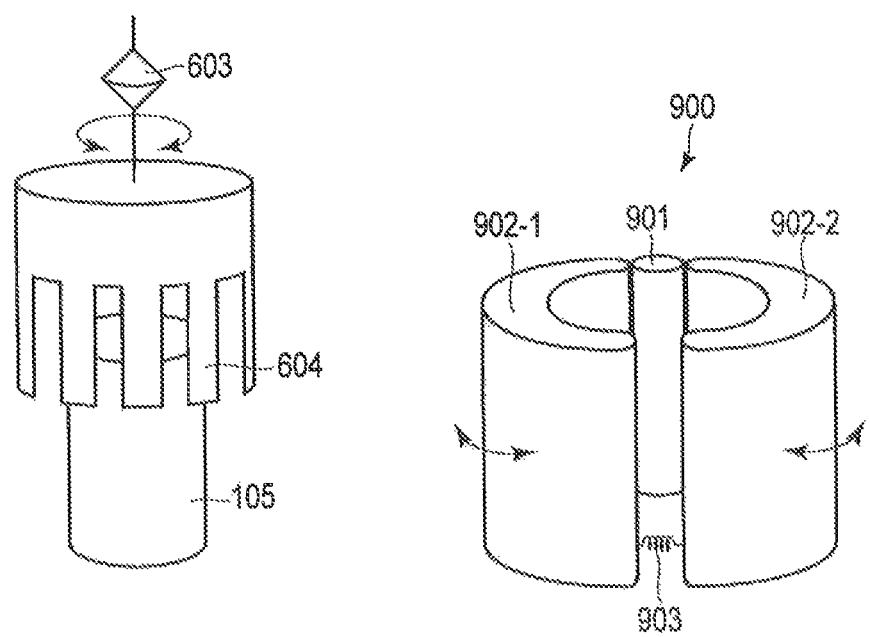
FIG. 8 is a perspective view exemplarily showing the elastic member shown in FIG. 6.
FIG. 9 is a perspective view exemplarily showing a switching member included in the tunable filter apparatus according to the first embodiment.

As exemplarily shown in FIG. 8, the shape of the elastic member 604 may also be a cylindrical shape having notches in the circumferential wall. When an external force acts, the elastic member 604 shown in FIG. 8 surrounds the circumferential wall of the characteristic tuning member 105 by contracting toward the axis of the elastic member 604, and hence can efficiently transmit the rotary driving force.

The switching member which gives the elastic member 604 an external force has an almost cylindrical shape, and accommodates the elastic member 604 in the hollow portion. Note that one switching member is prepared for one elastic member 604. More specifically, the switching member includes at least one movable member, and an elastic body connected to the movable member. The movable member may receive an external force from the movable gapped mechanism 605. The movable member is displaced in accordance with the external force and comes in contact with the outer wall of the elastic member 604, thereby transmitting the external force to the elastic member 604. As a consequence, the elastic member 604 can deform and come in contact with the circumferential wall of the characteristic tuning member 105. On the other hand, if the movable member does not receive any sufficient external force from the movable gapped mechanism 605, the movable member is displaced by the restoring force of the elastic body, and separates from the outer wall of the elastic member 604. Consequently, the elastic member 604 can separate, by its own restoring force, from the circumferential wall of the characteristic tuning member 105.

Note that at least one movable member desirably has a large contact area to the outer wall of the elastic member 604 in order to efficiently transmit an external force when the external force acts. More specifically, at least one movable member cam have a circumferential wall curved (into, e.g., an arc shapes along the outer wall of the elastic member 604. In addition, when the circumferential wall of this movable member has a shape curved between first and second end portions, the first end portion is connected to the elastic body, and the second end portion is fixed to the rotating shaft. This movable member can rotate around the rotating shaft in accordance with an external force received from the movable gapped mechanism 605 or the restoring force of the elastic body.

More specifically, a switching member 900 exemplarily shown in FIG. 9 can be adopted in this embodiment. The switching member 900 includes a rotating shaft 901, movable members 902-1 and 902-2, and an elastic body 903.

The movable members 902-1 and 902-2 each have a circumferential wall curved into an almost semi-circular shape along the outer wall of the (almost cylindrical) elastic member 604. The movable members 902-1 and 302-2 are arranged such that first end portions of the circumferential walls face each other and second end portions of the circumferential walls face each other. The first end portions of the circumferential walls of the movable members 902-1 and 902-2 are connected to the common elastic body 903. The second end portions of the circumferential walls of the movable members 902-1 and 902-2 are fixed to the common rotating shaft 901.

Figure 11:
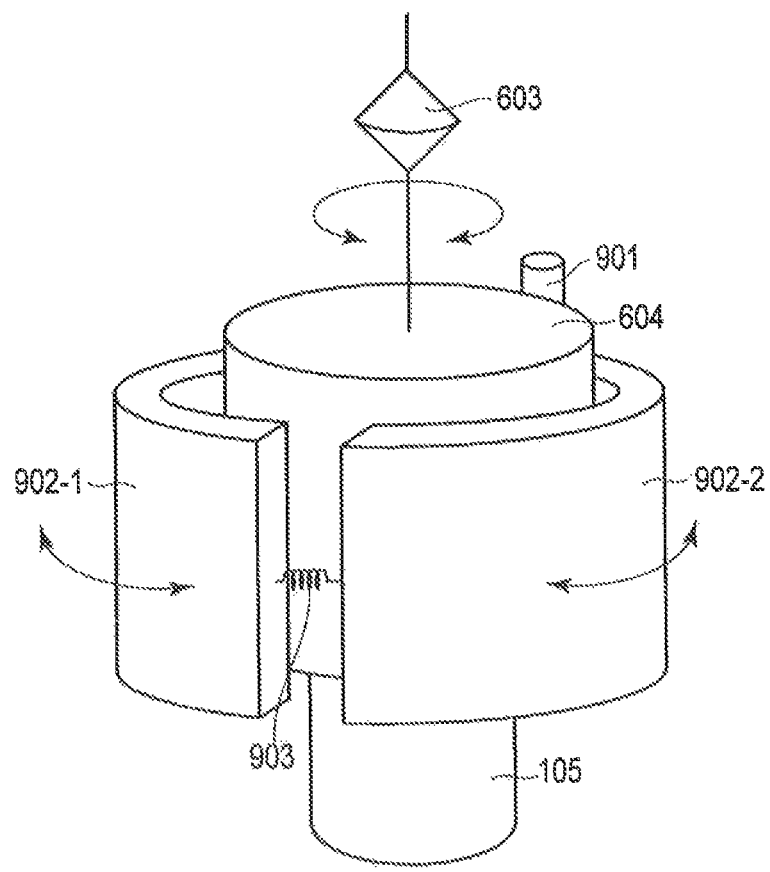
FIG. 11 is a perspective view exemplarily showing a combined structure of the characteristic tuning member, rotary driving mechanism, and elastic member shown in FIG. 6 and the switching member shown in FIG. 9.

As exemplarily shown in FIG. 11, the elastic member 604 (and the characteristic tuning member 105) is accommodated in an almost columnar hollow formed by the rotating shaft 901, the circumferential walls of the movable members 902-1 and 902-2, and the elastic body 903.

Upon receiving an external force from the movable gapped mechanism 605, the elastic body 903 contracts, and the first end portions of the circumferential walls of the movable members 902-1 and 902-2 are pulled by the elastic body 903. Consequently, the movable members 902-1 and 902-2 passively rotate around the rotating shaft 901, thereby clamping the elastic member 604. On the other hand, if no sufficient external force is received from, the movable gapped mechanism 605, the first end portions of the circumferential walls of the movable members 902-1 and 902-2 are pushed back by the restoring force of the elastic body 903. As a consequence, the movable members 902-1 and 902-2 passively rotate around the rotating shaft 901, thereby releasing the elastic member 604.

The movable gapped mechanism 605 includes a gapped member having one or more gaps, a driving mechanism for driving this gapped member in a predetermination moving direction, and a fixing portion for fixing the driving mechanism. The driving mechanism can drive the gapped member either linearly or rotationally. When the dielectric substrate 101 is accommodated in a heat-insulating vacuum vessel, it is favorable to move the gapped member almost parallel to the first surface of the dielectric substrate 101 in order to give the heat-insulating vacuum vessel a low profile.

Each gap formed in the gapped member is formed to have a projection on a first inner wall, and accommodates at least one set of the characteristic tuning member 105, elastic member 604, and switching member 900. When moved to a predetermined position by the driving mechanism, the gapped member clamps the outer wall of the switching member by the above-mentioned projection and a second inner wall facing the first inner wall, thereby allowing an external force (a normal force) to act on the switching member. As a result, the elastic member 604 temporarily connects to the characteristic tuning member 105. On the other hand, this external force acting on the switching member disappears or sufficiently reduces (to such an extent that the connection between the elastic member 604 and characteristic tuning member 105 is canceled) when the gapped member moves away from the aforementioned predetermined position.

In addition, a projection may also be formed on that portion of the accent inner wall, which faces the above-mentioned projection. Furthermore, a plurality of projections may also be formed on the first inner wall so that an external force can act on a plurality of switching members at the same time.

Figure 10:
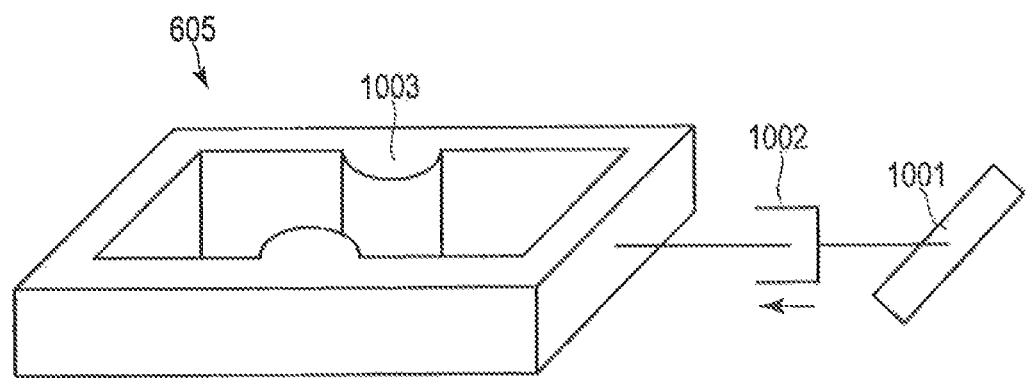
FIG. 10 is a perspective view exemplarily showing a movable gapped mechanism shown in FIG. 6.

More specifically, a movable gapped mechanism 605 exemplarily shown in FIG. 10 can be adopted in this embodiment. The movable gapped mechanism 605 shown in FIG. 10 includes a linear driving mechanism fixing portion 1001, linear driving mechanism 1002, and gapped member 1003.

The linear driving mechanism fixing portion 1001 fixes a first end portion of the linear driving mechanism 1002. As the linear driving mechanism fixing portion 1001, it is also possible to use, e.g., a portion of the supporting member 606. The first end portion of the linear driving mechanism 1002 is fixed to the linear driving mechanism fixing portion 1001, and a second end portion thereof opposite to the first end portion is connected to the gapped member 1003. The linear driving mechanism 1002 can linearly move the gapped member 1003 to an arbitrary position and stop the gapped member 1003 in that position by giving the gapped member 1003 a linear driving force. The linear driving mechanism 1002 can be a linear actuator, and can also be a combination of an electric motor and feed screw.

The gapped member 1003 has one gap including a first inner wall and a second inner wall facing the first inner wall. The first and second inner walls have projections facing each other. The wall surfaces of the first and second inner walls except the projections are almost parallel to a cylindrical surface defined by the moving direction of the gapped member 1003.

Figure 12:
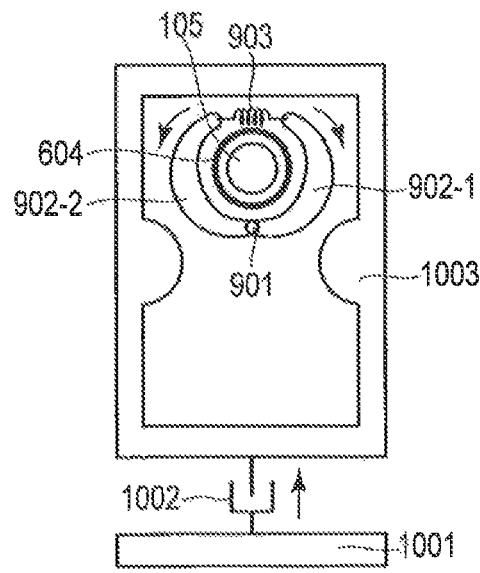
FIG. 12 is a plan view exemplarily showing a combined structure of the characteristic tuning member, elastic member, and switching member shown in FIG. 11 and the movable gapped mechanism shown in FIG. 10.

As exemplarily shown in FIG. 12, the movable gapped mechanism 605 shown in FIG. 10 can accommodate the characteristic tuning member 105, elastic member 604, and switching member 900 in the gap formed in the gapped member 1003. In this example shown in FIG. 12, the switching member 300 is not in contact with the inner walls or the gap, and hence does not receive any external force from the inner walls. Therefore, the characteristic tuning member 105 is not connected to the elastic member 604.

Figures 13A, 13B:
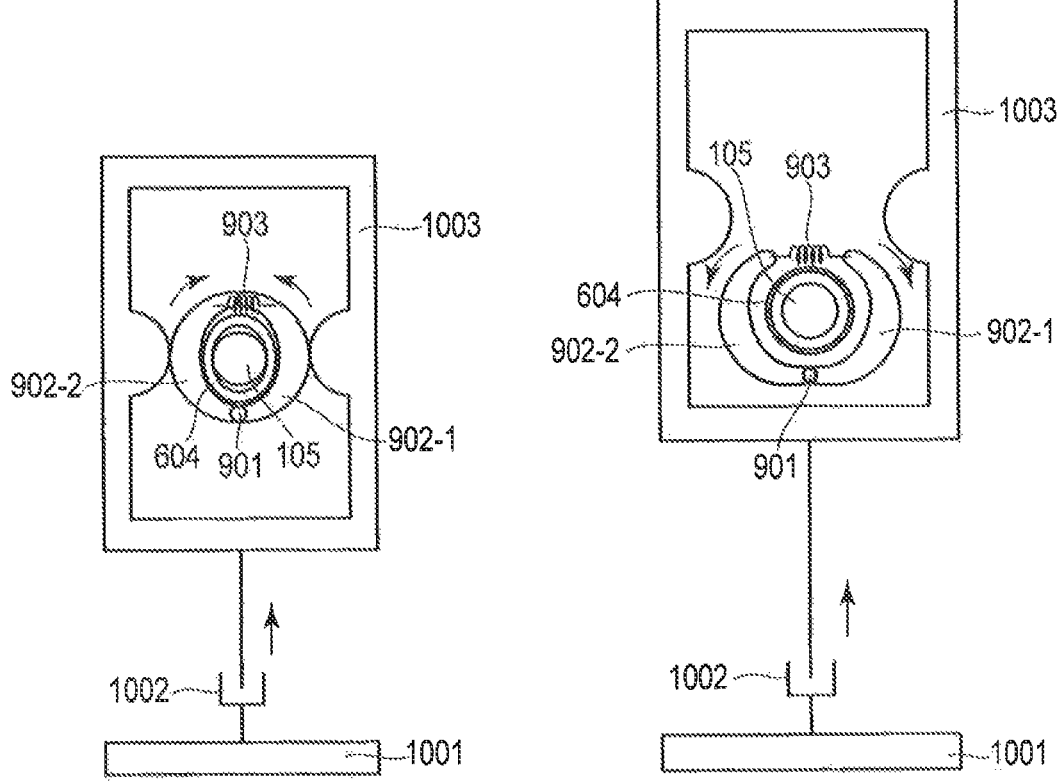
FIG. 13A is a view showing an operation example of the combined structure shown in FIG. 12.
FIG. 13B is a view showing an operation example of the combined structure shown in FIG. 12.

To start the adjustment of the initial gap length with respect to the characteristic tuning member 105, the linear driving mechanism 1002 need only drive the gapped member 1003 as exemplarily shown in FIG. 13A. In this example shown in FIG. 13A, the switching member 900 is clamped between the projections of the first and second inner walls of the gapped member 1003, and receives an external force from these projections. The elastic body 903 contracts due to this external force, and the switching member 900 clamps the elastic member 604. The elastic member 604 deforms in accordance with the external force from the switching member 900, and connects to the characteristic tuning member 105. Therefore, the characteristic tuning member 105 can receive the rotary driving force from the rotary driving mechanism 603 via the elastic member 604, and linearly move almost perpendicularly to the first surface of the dielectric substrate 101 while rotating. As a consequence, the initial gap length between the characteristic tuning member 105 and resonator 102 can be changed.

On the other hand, when terminating the adjustment of the initial gap length with respect to the characteristic tuning member 105, the linear driving mechanism 1002 need only drive the gapped member 1003 as exemplarily shown in FIG. 13B. In this example shown in FIG. 13B, the switching member 900 is spaced apart from the projections of the first and second inner walls of the gapped member 1003, and hence is not in contact with the inner walls of the gap. Since the switching member 900 is not receiving any external force from the inner walls of the gap, the elastic body 903 expands compared to the example shown in FIG. 13A, and the elastic member 604 is released from the switching member 900. The elastic member 604 separates, by its own restoring force, from the circumferential wall of the characteristic tuning member 105, thereby canceling the connection to the characteristic tuning member 105. Accordingly, the characteristic tuning member 105 is standing still even while the elastic member 604 is rotating.

Figure 14:
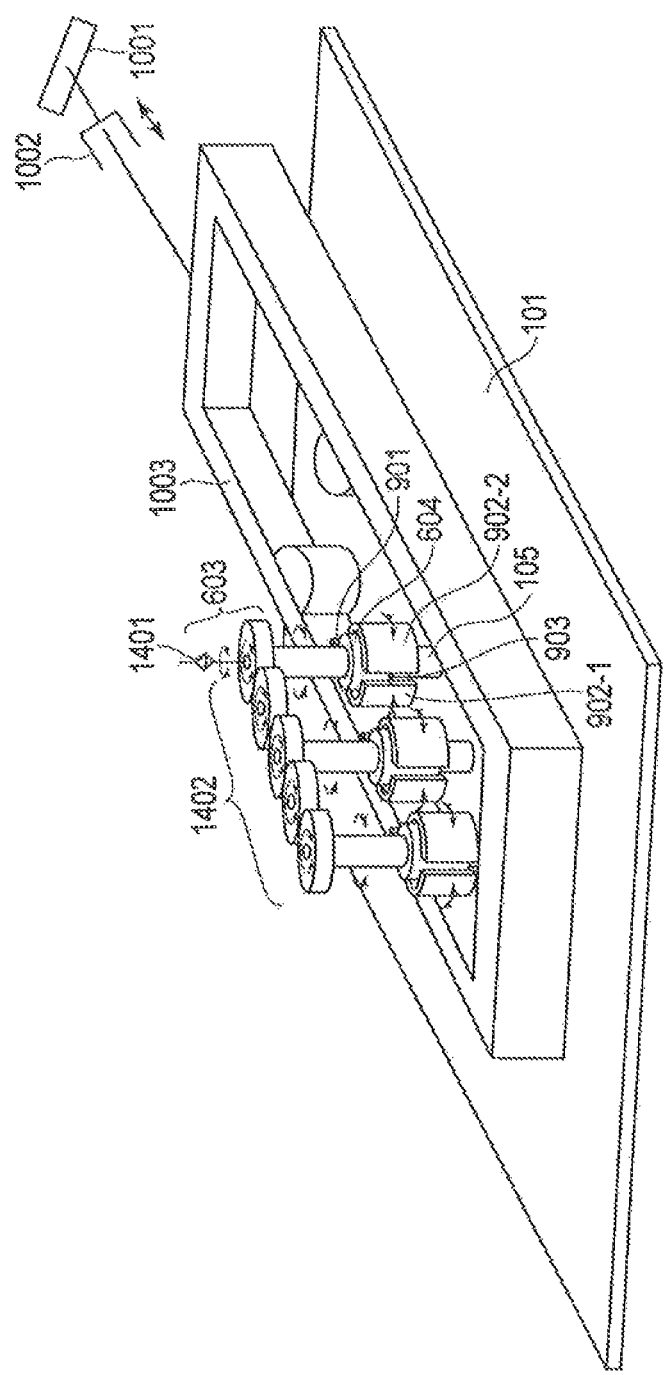
FIG. 14 is a perspective view partially showing an example of the tunable filter apparatus according to the first embodiment.

As exemplarily shown in FIG. 14, the gap of the gapped member 1003 can also accommodate a plurality of sets of the characteristic tuning members 105, elastic members 604, and switching members 900. The linear driving mechanism 1002 shown in FIG. 14 moves the gapped member 1003 so that the switching member 900 corresponding to a desired characteristic tuning member 105 is clamped between the projections of the first and second inner walls of the gap. When the gapped member 1003 moves to an appropriate position, the rotary driving force from the rotary driving mechanism 603 is transmitted to the desired characteristic tuning member 105, but is not transmitted to other characteristic tuning members 105. While the other characteristic tuning members 105 are standing still, therefore, the initial gap length between the desired characteristic tuning member 105 and a corresponding resonator 102 can be adjusted.

The rotary driving mechanism 603 shown in FIG. 14 includes a rotary actuator 1401 and transmission mechanism 1402. The transmission mechanism 1402 includes a plurality of gears, and each gear is so arranged as to mesh with one or more other gears. One of the plurality of gears is connected to the rotary actuator 1401, rotates by receiving a rotary driving force from the rotary actuator 1401, and transmits the rotary driving force to other gears. Each of the plurality of elastic members 604 is connected to one of the plurality of gears and receives the rotary driving force.

As exemplarily shown in FIG. 14, a rotary driving force is generated by the rotary actuators 1401 fewer than the elastic members 604, and transmitted to each elastic member 604 via the transmission mechanism 1402. This can simplify the rotary driving mechanism 603.

More specifically, the cost and mass can be reduced by implementing the rotary driving mechanism 603 by using a few rotary actuators. In addition, since the number of rotary actuators 1401 accommodated in a (heat-insulating) vacuum vessel decreases, the number of lines decreases, and the number of connection ports for extracting the lines of the vacuum vessel to the outside decreases accordingly. This leads to downsizing of the whole tunable filter apparatus.

Note that when the plurality of sets of the characteristic tuning members 105, elastic members 604, and switching members 900 are scattered, a plurality of gaps may also be used to accommodate these members. The plurality of gaps can be formed in one gapped member 1503 as exemplarily shown in FIG. 15, and can also be scattered in a plurality of gapped members.

The gapped member 1503 has a plurality of gaps each having a first inner wall and a second inner wall facing the first inner wall. The first and second inner walls have projections facing each other. The wall surfaces of the first and second inner walls except the projections are almost parallel to a cylindrical surface defined by the moving direction of the gapped member 1503.

Figure 15:
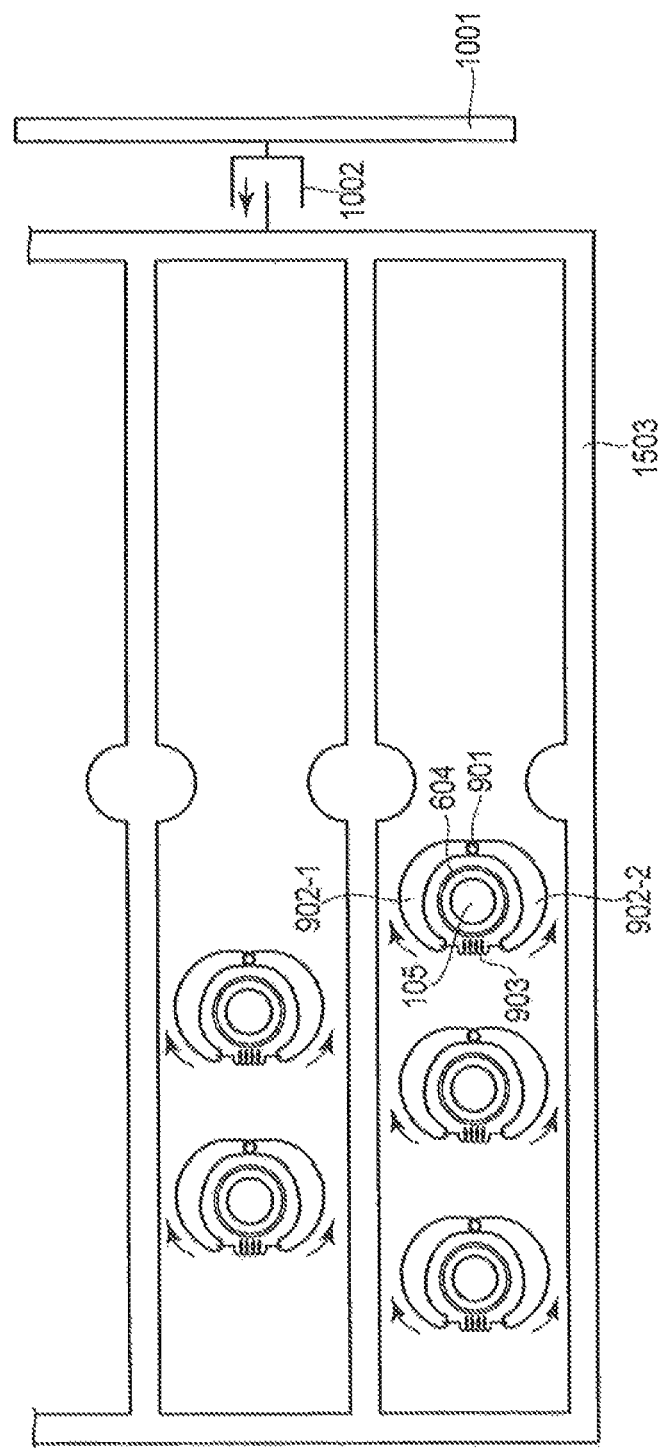
FIG. 15 is a plan view showing a modification of FIG. 12.

The linear driving mechanism 1002 shown in FIG. 15 moves the gapped member 1503 such that the switching member 900 corresponding to a desired characteristic tuning member 105 is clamped between the projections of the first and second inner walls of the gap accommodating the characteristic tuning member 105. When the gapped member 1503 moves to an appropriate position, the rotary driving force from the rotary driving mechanism 603 is transmitted to the desired characteristic tuning member 105, but is not transmitted to other characteristic tuning members 105. While the other characteristic tuning members 105 are standing still, therefore, the initial gap length between the desired characteristic tuning member 105 and a corresponding resonator 102 can be adjusted.

Note that the number and shape (including the positions of the projections) of gaps to be formed in the gapped member can be designed based on, e.g., the layout of the characteristic tuning members 105. Note also that the layout of the characteristic tuning members 105 depends on the layout of the resonators 102.

Figure 19:
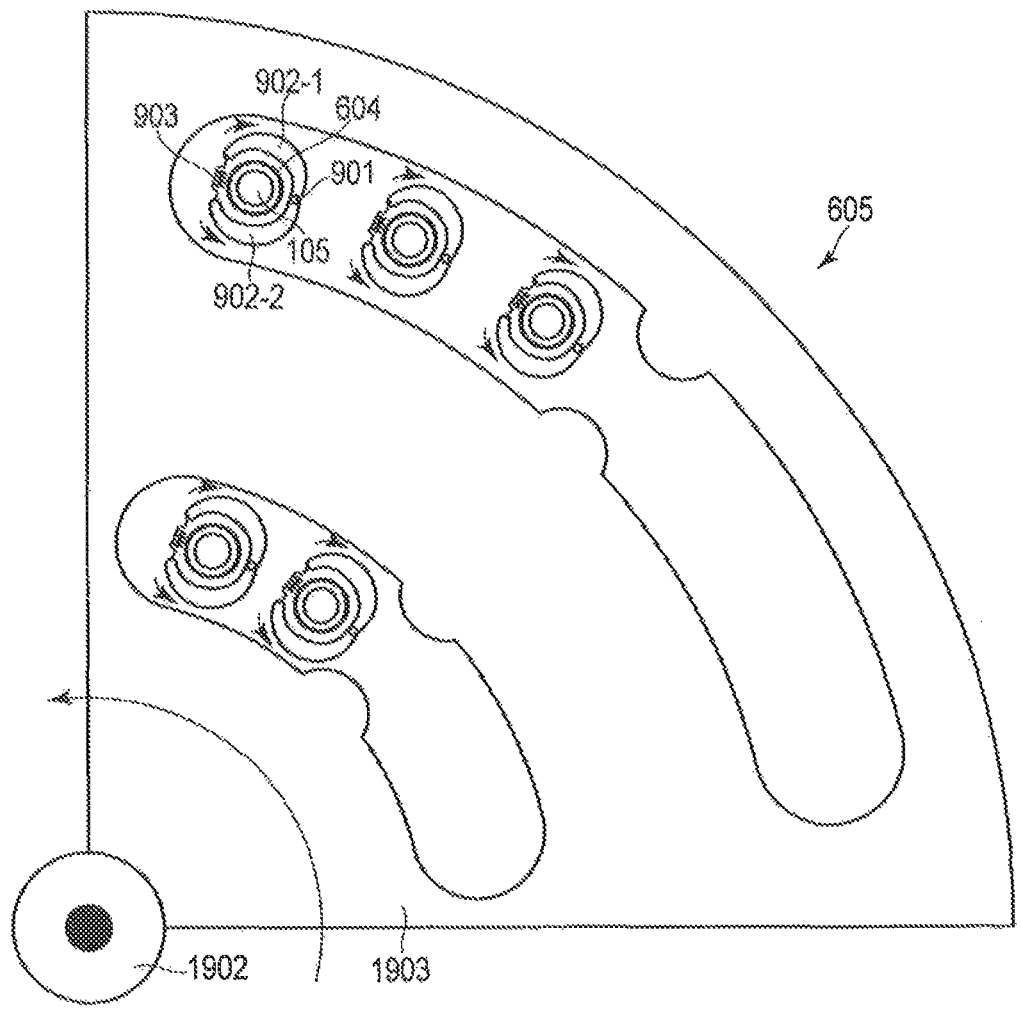
FIG. 19 is a plan view showing a modification of FIG. 12.

Alternatively, a movable gapped mechanism 605 exemplarily shown in FIG. 19 can also be adopted in this embodiment. The movable gapped mechanism 605 shown in FIG. 19 includes a rotary driving mechanism 1902 and gapped member 1903.

Figure 20:
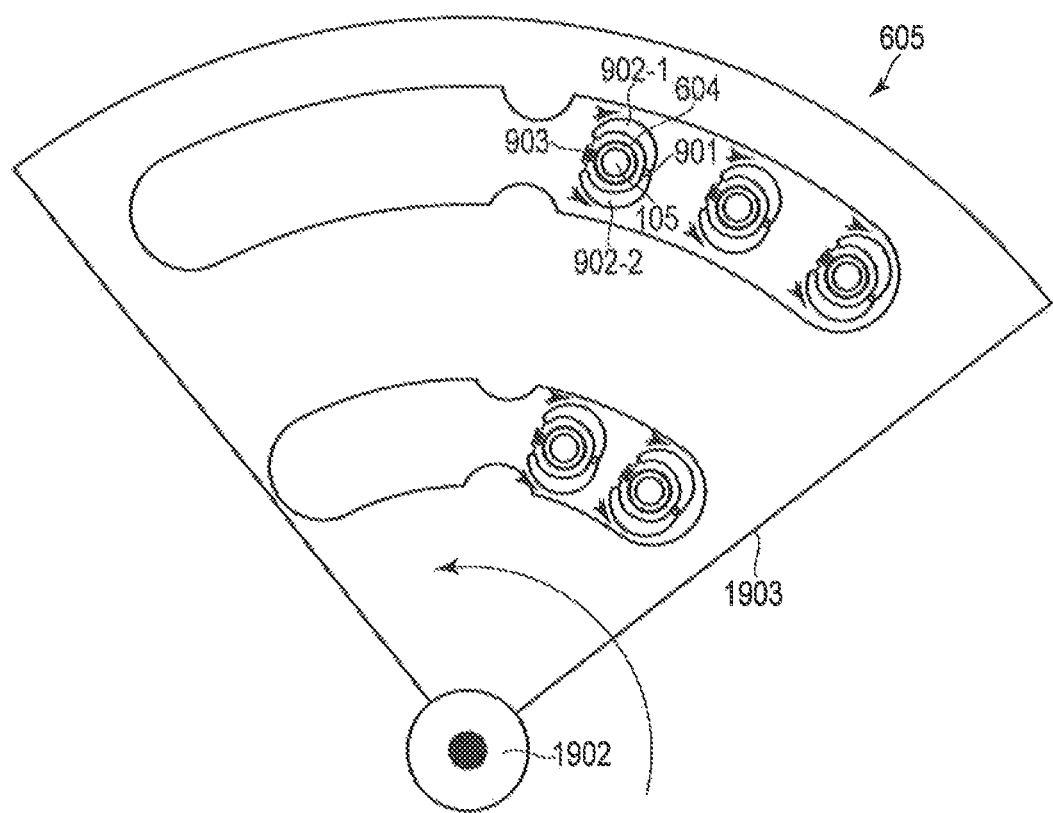
FIG. 20 is a view showing an operation example of a combined structure shown in FIG. 19.

The rotary driving mechanism 1902 is connected to the gapped member 1903. The rotary driving mechanism 1902 can give a rotary driving force to the gapped member 1903 and, as exemplarily shown in FIG. 20, can rotate the gapped member 1903 to an arbitrary position and stop the gapped member 1903 at that position. The rotary driving mechanism 1902 may also be, e.g., a rotary actuator.

The gapped member 1903 has two gaps each having a first inner wall and a second inner wall facing the first inner wall. The first and second inner walls have projections facing each other. The wall surfaces of the first and second inner walls except the projections are almost parallel to a cylindrical surface defined by the moving direction of the gapped member 1903.

The rotary driving mechanism 1902 moves the gapped member 1903 so that the switching member 900 corresponding to a desired characteristic tuning member 105 is clamped between the projections of the first and second inner walls of the gap accommodating the characteristic tuning member 105. When the gapped member 1903 moves to an appropriate position, the rotary driving force from the rotary driving mechanism 603 is transmitted to the desired characteristic tuning member 105, but is not transmitted to other characteristic tuning members 105. While the other characteristic tuning members 105 are standing still, therefore, the initial gap length between the desired characteristic tuning member 105 and a corresponding resonator 102 can be adjusted.

In the tunable filter apparatus according to the first embodiment as explained above, the rotary driving mechanism gives a rotary driving force to the characteristic tuning member having at least one portion corresponding to a screw, and displaces the characteristic tuning member in the linear direction by using the rotary driving force, thereby adjusting the initial gap length between the characteristic tuning member and a corresponding resonator. Accordingly, this tunable filter apparatus can adjust the initial gap length at high speed and high accuracy compared to manual adjustment. Especially when the tunable filter apparatus is corresponding to a superconducting filter, the initial gap length can repetitively be adjusted until desired initial filter characteristics are obtained, while a vacuum low-temperature environment is maintained.

The rotary driving force from the rotary driving mechanism is also given to the elastic member which can temporarily come in contact with/separate from the circumferential wall of the characteristic tuning member by an external force/restoring force. When the elastic member is in contact with the circumferential wall of the characteristic tuning member, the rotary driving force is further transmitted to the characteristic tuning member. When the elastic member is spaced apart from the circumferential wall of the characteristic tuning member, the rotary driving force is not transmitted to the characteristic tuning member. In this filter apparatus, therefore, even when the rotary driving force is given to a plurality of elastic members at once, the initial gap length of a desired characteristic tuning member can be adjusted while undesired characteristic tuning members are standing still. That is, even when a large number of characteristic tuning members are arranged, the initial gap lengths of the characteristic tuning members can individually be adjusted by time-divisionally sharing a few actuators.

Second Embodiment

The difference of a tunable filter apparatus according to the second embodiment from the tunable filter apparatus (FIG. 6) according to the first embodiment is the driving principle of a supporting member 602.

More specifically, as exemplarily shown in FIG. 16, the supporting member 602 included in the tunable filter apparatus according to this embodiment receives a linear driving force from a linear actuator 1601-1 connected to a first end portion, and a linear actuator 1601-2 connected to a second end portion opposite to the first end portion. By this linear driving force received by the two end portions, the supporting member 602 can be displaced almost perpendicularly with respect to a first surface of a dielectric substrate 101 while maintaining an inclination to the first surface.

The linear actuators 1601-1 and 1601-2 can also be piezoelectric actuators. In this case, springs 1602-1 and 1602-2 are connected between the supporting member 602 and a foundation, in order to give a preload to the piezoelectric actuators. Lead wires (not shown) are connected to the piezoelectric actuators in order to apply a control voltage. The piezoelectric actuators expand and contract almost perpendicularly to the first surface of the dielectric substrate 101 in accordance with the control voltage. A characteristic tuning member 105 supported fey the supporting member 602 is displaced in synchronism with the expansion/contraction of the piezoelectric actuators.

In the tunable filter apparatus according to the second embodiment as explained above, the supporting member supporting the characteristic tuning member is displaced almost perpendicularly with respect to a circuit mounting surface of the dielectric substrate while maintaining an inclination to the circuit mounting surface, by the linear driving force from the linear actuators connected to the two end portions of the supporting member. In this tunable filter apparatus, therefore, the characteristic tuning member is displaced while its bottom surface keeps being almost parallel to the circuit mounting surface of the dielectric substrate. This makes it possible to accurately adjust the gap length.

Third Embodiment

Although not shown in FIGS. 6 and 16, the tunable filter apparatus according to the first or second embodiment described above requires drivers for controlling the various driving mechanisms, and a measurement device for checking the tuned filter characteristics. In addition, when the tunable filter apparatus is corresponding to a superconducting filter, the tunable filter apparatus also requires various peripheral devices for setting a vacuum low-temperature environment.

As exemplarily shown in FIG. 17, a tunable filter system according to the third embodiment includes a heat-insulating vacuum, vessel 1701, vacuum pump 1702, refrigerator 1703, cold head 1704, cold plate 1705, tunable filter apparatus 1706, connector 1707, connector 1708, connector 1709, input connector 1710, coaxial cable 1711, coaxial cable 1712, output connector 1713, coaxial cable 1714, coaxial cable 1715, interconnection cable 1716, interconnection cable 1717, frequency characteristic measurement device 1718, and driver 1719.

The tunable filter apparatus 1706 is corresponding to the tunable filter apparatus according to the above-described first or second embodiment. However, at least some of circuit elements (e.g., a resonator, signal input line, and signal output line) of the tunable filter apparatus 1706 are formed by using a superconducting material.

The heat-insulating vacuum vessel 1701 has an almost boxy shape and accommodates the tunable filter apparatus 1706. A vacuum low-temperature environment is set around the tunable filter apparatus 1706 by the actions of the vacuum pump 1702 and refrigerator 1703 (to be described later). The heat-insulating vacuum vessel 1701 prevents the invasion of external heat and air in order to maintain the set vacuum low-temperature environment.

For example, the heat-insulating vacuum vessel 1701 can be separated into a lower vessel corresponding to the bottom and sidewalls of the heat-insulating vacuum vessel 1701 and having an opening opposite to the bottom, and an upper vessel corresponding to the top and sidewalls of the heat-insulating vacuum vessel 1701 and having an opening opposite to the top. In this case, an internal space can be formed by connecting the upper and lower vessels such that their openings face each other. For example, the vacuum degree of the internal space of the heat-insulating vacuum vessel 1701 can be maintained by connecting the upper and lower vessels via an O-ring.

The vacuum pump 1702 evacuates the internal space of the heat-insulating vacuum vessel 1701. The refrigerator 1703 includes the cold head 1704, and cools the cold head 1704 after the internal space of the heat-insulating vacuum vessel 1701 is almost evacuated.

The cold head 1704 supports the cold plate 1705. Also, the cold plate 1705 supports the tunable filter apparatus 1706. When the refrigerator 1703 cools the cold head 1704 and its temperature falls, heat conduction from the cold plate 1705 to the cold head 1704 occurs, so the cold plats 1705 is also cooled. When the temperature of the cold plate 1705 falls, heat conduction from the tunable filter apparatus 1706 to the cola plate 1705 occurs, so the tunable filter apparatus 1706 is also cooled.

The refrigerator 1703 must cool the tunable filter apparatus 1706 to a temperature at which the superconducting material contained in the tunable filter apparatus 1706 shows a superconducting characteristic. Note that it can be expected that the superconducting characteristic improves as the environmental temperature falls, so the tunable filter apparatus 1706 is preferably set at as low a temperature as possible. The refrigerator 1703 need have a function of sufficiently cooling the tunable filter apparatus 1706, and can be any of various refrigerators such as a pulse tube refrigerator, Stirling refrigerator, and GM (Gifford-McMahon) refrigerator.

The refrigerator 1703 vibrates during the cooling operation. This vibration is transmitted to the tunable filter apparatus 1706 via the cold head 1704 and cold plate 1705. The vibration may loosen fixation of a characteristic tuning member included in the tunable filter apparatus 1706 and shift the position.

In the example shown in FIG. 17, the tunable filter apparatus 1706 vibrates in the gravity direction, and the cold plate 1705 supports the tunable filter apparatus 1706 such that the circuit mounting surface of the dielectric substrate is almost horizontal to the gravity direction, so the vibration direction matches the moving direction of the characteristic tuning member. Therefore, even when the initial gap length with respect to the characteristic tuning member is optimized beforehand, the position of the characteristic tuning member may shift while the vacuum low-temperature environment is set. The tunable filter apparatus according to the above-described first or second embodiment can eliminate this positional shift of the characteristic tuning member by adjusting the initial gap length after the vacuum low-temperature environment is set, without canceling the environment.

The connectors 1707, 1708, and 1709 are attached to the sidewalls, top or bottom of the heat-insulating vacuum vessel 1701, as interfaces between the tunable filter apparatus 1706 and the peripheral devices (more specifically, the frequency characteristic measurement device 1718 and driver 1719).

The frequency characteristic measurement device 1716 is, e.g., a network analyzer, supplies test signals having various frequencies to the tunable filter apparatus 1706, and measures the responses. The input connector 1710 of the tunable filter apparatus 1706 is connected to the output terminal of the frequency characteristic measurement device 1718 via the coaxial cable 1711, connector 1707, and coaxial cable 1712. The output connector 1713 of the tunable filter apparatus 1706 is connected to the input terminal of the frequency characteristic measurement device 1718 via the coaxial cable 1714, connector 1708, and coaxial cable 1715.

The driver 1719 supplies a control signal (control voltage) to various driving mechanisms (e.g., an above-described linear actuator 601, rotary driving mechanism 603, movable gapped mechanism 605, linear driving mechanism 1002, rotary actuator 1401, linear actuator 1601-1, linear actuator 1601-2, and rotary driving mechanism 1902) included in the tunable filter apparatus 1706, and controls the operations (i.e., the magnitudes and directions of the driving forces) of these driving mechanisms. A control terminal (not shown) of the tunable filter apparatus 1706 is connected to the output terminal of the driver 1719 via the interconnection cable 1716, connector 1709, and interconnection cable 1717.

In the tunable filter system according to the third embodiment as explained above, a positional shift of the characteristic tuning member, which occurs due to vibrations from the refrigerator while a vacuum low-temperature environment for a superconducting characteristic is set, is eliminated by adjusting the initial gap length after the environment is set. Accordingly, this tunable filter system can use a refrigerator which generates relatively large vibrations.

Fourth Embodiment

The filter characteristic of the tunable filter apparatus according to the first or second embodiment described above can also automatically be adjusted. More specifically, as shown in FIG. 18, a tunable filer system according to the fourth embodiment includes a controller 1800, filter circuit 1810, input connector 1811, output connector 1812, and driving mechanism 1820.

The controller 1800 analyses the filter characteristic of the filter circuit 1810, compares the filter characteristic with a desired filter characteristic, generates a difference signal indicating the difference between them, and performs negative-feedback control on the driving mechanism 1820 in accordance with the difference signal, thereby automatically improving the filter characteristic. More specifically, the controller 1800 includes a frequency characteristic measurement device 1801, arithmetic circuit 1802, and driver 1803.

The frequency characteristic measurement device 1601 receives an output signal (sig.2) from the filter circuit 1810 via the output connector 1812. The frequency characteristic measurement device 1801 measures the spectral waveform (e.g., the center frequency, passing characteristic, and reflection characteristic) of the output signal from the filter circuit 1810. The frequency characteristic measurement device 1801 outputs a measurement signal indicating this spectral waveform to the arithmetic circuit 1802.

The arithmetic circuit 1802 receives this measurement signal from the frequency characteristic measurement device 1801. The arithmetic circuit 1802 compares the spectral waveform indicated by the measurement signal with a desired spectral waveform, and generates a difference signal indicating the difference between them. The arithmetic circuit 1802 outputs this difference signal to the driver 1803.

The driver 1803 receives the difference signal from the arithmetic circuit 1802, and generates a control signal (control voltage) for controlling the operation (i.e., the magnitude and direction of the driving force) of the driving mechanism 1820 in accordance with the difference signal. The driver 1803 outputs the control signal to the driving mechanism 1820.

The filter circuit 1810, input connector 1811, output connector 1812, and driving mechanism 1820 are corresponding to the tunable filter apparatus according to the above-described first or second embodiment.

The filter circuit 1810 can include some or all of the dielectric substrate 101, resonator 102, signal input line 103, signal output line 104, and characteristic tuning member 105 described previously. The filter circuit 1810 receives an input signal (sig.1) via the input connector 1811. The filter circuit 1810 obtains an output signal by filtering the input signal. The filter circuit 1810 supplies this output signal to the controller 1800 and an external apparatus (not shown) via the output connector 1812.

The driving mechanism 1820 can include some or all of the above-described linear actuator 601, rotary driving mechanism 603, movable gapped mechanism 605, linear driving mechanism 1002, rotary actuator 1401, linear actuator 1601-1, linear actuator 1601-2, and rotary driving mechanism 1902. The driving mechanism 1820 receives the control signal from the controller 1800, and operates in accordance with the control signal.

As explained above, the tunable filter system according to the fourth embodiment performs negative-feedback control on the various driving mechanisms in accordance with the difference of the measured filter characteristic from the desired filter characteristic. Therefore, this tunable filter system can automatically improve the filter characteristic.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A filter characteristic tuning apparatus comprising:
a characteristic tuning member that faces a resonator on a first surface of a substrate of a tunable filter apparatus;
an elastic member that comes in contact with the characteristic tuning member by deformation, and separates from the characteristic tuning member by a restoring force;
a first driving mechanism that rotates the elastic member;
a first movable member that deforms the elastic member by externally coming into contact with the elastic member in a closing operation, and causes the elastic member to use a restoring force in an opening operation;
a second movable member that has a projection for opening/closing the first movable member; and
a second driving mechanism that displaces the second movable member such that the projection opens/closes the first movable member, wherein
the elastic member transmits a rotary driving force from the first driving mechanism by coming into contact with the characteristic tuning member, and
the characteristic tuning member changes a gap between the characteristic tuning member and the resonator by a linear driving force obtained by converting the transmitted rotary driving force.

2. The apparatus according to claim 1, wherein
a total number of the elastic members and a total number of the first movable members are not less than two, and
the first driving mechanism includes a rotary actuator, and a transmission mechanism that transmits a rotary driving force generated by the rotary actuator to each of the elastic members.

3. The apparatus according to claim 2, wherein
the transmission mechanism includes a plurality of gears,
each of the gears is arranged to mesh with not less than one other gear,
one of the gears is connected to the rotary actuator, and transmits the rotary driving force from the rotary actuator to not less than one other gear, and
each of the elastic members is connected to one of the gears, and receives the rotary driving force via the gear.

4. The apparatus according to claim 1, wherein
the first movable member includes not less than one third movable member that is displaced in accordance with an external force, thereby coming into contact with an outer wall of the elastic member and deforming the elastic member, and an elastic body that separates the third movable member from the outer wall of one elastic member by displacing the third movable member by a restoring force,
the third movable member has a sidewall including a first end portion connected to the elastic body and a second end portion fixed to a rotating shaft, and rotates around the rotating shaft in accordance with the restoring force of the elastic body or the external force, and
the sidewall of the third movable member has a shape in which a portion between the first end portion and the second end portion is curved along the outer wall of the elastic member.

5. The apparatus according to claim 1, wherein the second driving mechanism linearly moves or rotates the second movable member substantially parallel to the first surface of the substrate.

6. The apparatus according to claim 1, wherein
the second driving mechanism linearly moves the second movable member,
the second movable member has a gap that accommodates the characteristic tuning member, the elastic member, and the first movable member, and has a projection on a first inner wall of the gap, and
a wall surface of the first inner wall of the gap except the projection is substantially parallel to a cylindrical surface defined by a moving direction of the second movable member.

7. The apparatus according to claim 1, wherein
the second driving mechanism rotates the second movable member,
the second movable member has a gap that accommodates the characteristic tuning member, the elastic member, and the first movable member, and has a projection on a first inner wall of the gap, and
a wall surface of the first inner wall of the gap except the projection is substantially parallel to a cylindrical surface defined by a moving direction of the second movable member.

8. The apparatus according to claim 1, further comprising:
a supporting member that supports the characteristic tuning member such that the characteristic tuning member faces the resonator; and
a third driving mechanism that changes a gap between the characteristic tuning member and the resonator by displacing the supporting member.

9. The apparatus according to claim 1, wherein the resonator is formed by patterning on the first surface of the substrate by using a superconducting material.

10. A tunable filter apparatus comprising:
a substrate;
a resonator formed by patterning on a first surface of the substrate by using a conductor material;
a characteristic tuning member that contains one of a dielectric material, a magnetic material, and a conductor material, and has a screw portion;
a supporting member that supports the characteristic tuning member such that the characteristic tuning member faces the resonator;
an elastic member that comes in contact with a sidewall of the characteristic tuning member by deforming in accordance with a first external force, and separates from the sidewall of the characteristic tuning member by a restoring force when the first external force is not acting;
a first driving mechanism that rotates the elastic member;
a switching member that includes a movable member that is displaced in accordance with a second external force, thereby coming into contact with an outer wall of the elastic member and causing the first external force to act on the elastic member, and an elastic body that separates the movable member from the outer wall of the elastic member by displacing the movable member by a restoring force when the second external force is not acting;

a gapped member that has a gap that accommodates a set of the characteristic tuning member, the elastic member, and the switching member, and has a projection on a first inner wall of the gap; and a second driving mechanism that displaces the gapped member such that the second external force acts on the switching member by clamping an outer wall of the switching member accommodated in the gap by the projection of the gap and a second inner wall facing the first inner wall, wherein while the elastic member is in contact with a circumferential wall of the characteristic tuning member, the elastic member transmits, to the characteristic tuning member via a frictional force, a rotary driving force received from the first driving mechanism, and the characteristic tuning member is displaced in accordance with a linear driving force obtained by converting, by the screw portion, the rotary driving force transmitted from the elastic member, thereby changing a gap length between the characteristic tuning member and a corresponding resonator.

11. A control method for a tunable filter apparatus, wherein the apparatus comprises:

a substrate;

a resonator formed by patterning on a first surface of the substrate by using a conductor material;

a characteristic tuning member that contains one of a dielectric material, a magnetic material, and a conductor material, and has a screw portion;

a supporting member that supports the characteristic tuning member such that the characteristic tuning member faces the resonator;

an elastic member that comes in contact with a sidewall of the characteristic tuning member by deforming in accordance with a first external force, and separates from the sidewall of the characteristic tuning member by a restoring force when the first external force is not acting;

a first driving mechanism connected to the elastic member;

a switching member that includes a movable member that is displaced in accordance with a second external force, thereby coming into contact with an outer wall of the elastic member and causing the first external force to act on the elastic member, and an elastic body that separates the movable member from the outer wall of the elastic member by displacing the movable member by a restoring force when the second external force is not acting;

a gapped member that has a gap that accommodates a set of the characteristic tuning member, the elastic member, and the switching member, and has a projection on a first inner wall of the gap; and a second driving mechanism connected to the gapped member, the method comprises:

causing the first driving mechanism to rotate the elastic member; and causing the second driving mechanism to displace the gapped member such that the second external force acts on the switching member by clamping an outer wall of the switching member accommodated in the gap by the projection of the gap and a second inner wall facing the first inner wall, while the elastic member is in contact with a circumferential wall of the characteristic tuning member, the elastic member transmits, to the characteristic tuning member via a frictional force, a rotary driving force received from the first driving mechanism; and the characteristic tuning member is displaced in accordance with a linear driving force obtained by converting, by the screw portion, the rotary driving force transmitted from the elastic member, thereby changing a gap length between the characteristic tuning member and a corresponding resonator.

* * * * *

UNITED STATES PATENT AND TRADEMARK OFFICE
CERTIFICATE OF CORRECTION

PATENT NO. : 9,837,694 B2
APPLICATION NO. : 15/062490
DATED : December 5, 2017
INVENTOR(S) : Tanaka et al.

Page 1 of 1

It is certified that error appears in the above-identified patent and that said Letters Patent is hereby corrected as shown below:

In the Claims

Claim 10, Column 20, Line 52, change "sidewali" to --sidewall--.

Signed and Sealed this
Twentieth Day of February, 2018

Andrei Iancu
*Director of the United States Patent and Trademark Office*